United States Patent [19]

Bourdon

[11] 4,173,661

[45] Nov. 6, 1979

[54] METHOD FOR DEPOSITING THIN LAYERS OF MATERIALS BY DECOMPOSING A GAS TO YIELD A PLASMA

[75] Inventor: Bernard Bourdon, Orsay, France

[73] Assignee: Alsthom-Atlantique, Paris, France

[21] Appl. No.: 846,073

[22] Filed: Oct. 27, 1977

[30] Foreign Application Priority Data

Nov. 18, 1976 [FR] France ................................ 76 34688

[51] Int. Cl.$^2$ ............................................. B05D 3/06
[52] U.S. Cl. ...................................... 427/39; 204/168
[58] Field of Search ............... 427/38, 39; 204/192 R, 204/192 C, 192 S, 298, 168

[56] References Cited

U.S. PATENT DOCUMENTS 4,025,339  5/1977  Kuehnle ........................... 204/192 S

FOREIGN PATENT DOCUMENTS 50-40116 12/1975 Japan ............................................ 427/39

*Primary Examiner*—John H. Newsome
*Attorney, Agent, or Firm*—Sughrue, Rothwell, Mion, Zinn and Macpeak

[57] ABSTRACT

The invention provides a method of depositing a thin layer of material by decomposing a gas in a plasma. To avoid saturating the rate of depositing doped silicon, the substrate onto which the doped silicon is to be deposited has an RF bias applied thereto with respect to the plasma. The improvement resides in circulating in the chamber a gaseous medium at a pressure between $10^{-2}$ and $10^{-4}$ torr in the vicinity of the substrate by jetting the gaseous medium into the chamber, via a tube in which the pressure is maintained between 0.2 and 4 torr, through injection ports which face the substrate. The method is useful in the manufacture of semiconductor components.

10 Claims, 3 Drawing Figures

METHOD FOR DEPOSITING THIN LAYERS OF MATERIALS BY DECOMPOSING A GAS TO YIELD A PLASMA

FIELD OF THE INVENTION

The present invention concerns a method for depositing thin layers of materials by decomposing a gas to yield a plasma. Such thin layers are also called thin films.

BACKGROUND OF THE INVENTION

Such methods are required in the manufacture of silicon semiconductor devices including deposited layers of silicon which may contain doping impurities. The deposited layers may be continuous with the crystal structure of a monocrystalline silicon substrate. The same applies when the semiconductor material to be deposited is silicon carbide (SiC).

In the case just mentioned, it is well known that the deposited layers must be very pure. There are several known methods for achieving these high levels of purity, one of which is cathode sputtering. In this process the material to be deposited consists of a solid target. A direct current electric field is generated in the vicinity of the target, in the presence of a plasma which may be generated by means of a high-frequency electric field. The direct current field causes ion bombardment of the target. This releases atoms of the target material, which are deposited on the nearby semiconductor substrate.

The quality of the deposit may be improved by electrically biasing the substrate relative to the plasma, for example by connecting the substrate to the target when the latter is one of the conductive surfaces between which the high-frequency field is formed, and this enables the direct current field to be obtained from the high-frequency source. In this case, the connection to the substrate is made via an impedance such as a variable capacitance (see CHRISTENSEN et al, "RF biasing through capacitive collector to target coupling in RF diode sputtering"—Journal of Physics E: Scientific Instruments, 1972, vol 5, United Kingdom). This known method is not used, however, when the deposit is obtained from a material in the gaseous phase, instead of from an expensive solid target.

Another known method consists in placing the substrate in a chamber through which is passed a gas from which the material to be deposited can be formed by thermal decomposition. This method is known as chemical vapour deposition (CVD). It requires that the substrate be heated, and has the disadvantage that the temperature required may result in deterioration of the substrate properties, for example if the substrate consists of a semiconductor slab on which layers of alternate conductivity have already been formed. The doping impurities which form these layers tend to migrate through the semiconductor material when it is heated.

Chemical vapour deposition is discussed in "On the enhancement of silicon chemical vapour deposition rates at low temperatures" (CHIN-AN-CHANG, J. Electrochem. Soc. Solid-state Science and Technology, vol 123, No. 8, August 1976, p 1245). This paper indicates that the rate at which doped silicon is deposited can be increased by electrically biasing the substrate, but the paper is not concerned with attempting to avoid heating of the substrate altogether.

A third known method consists in introducing a gas such as silane ($SiH_4$) continuously into a chamber and decomposing it by virtue of the electronic shock effect produced in a plasma by a high-frequency electric field. This method is generally satisfactory, and the rate of deposition can be increased, if necessary, by increasing the power input to the electric field and/or the partial pressure of the silane. When high concentrations of doping impurities such as arsenic are required, by mixing arsine ($AsH_3$) with the silane, for example, the rate of deposition reaches a "saturation" value, and cannot be further increased by increasing the power input to the high-frequency field.

German published patent application (Deutsche Offenlegungschrift) N° 2,312,774 (VEB Elektromat) proposes a method of depositing a thin film by plasma decomposition in which the substrate is electrically biased with respect to the plasma. The purpose of this is to avoid untimely chemical reactions within the plasma which can lead to a deposit which has no mechanical cohesion. The biasing is provided by a DC generator connected between the substrate and a conductive probe inserted in the plasma. Such biasing is not applicable when the deposited material is insulative since there is a tendency for an oposing charge to build up on the deposit. It does not allow a satisfactory deposition rate to be obtained when the material to be deposited is a poor conductor, e.g. a semiconductor.

Preferred embodiments of the present invention provide a method for depositing thin layers of materials by decomposing a gas to yield a plasma which gives high rates of deposition even when the deposited material is a semiconductor including a high proportion of semiconductor doping impurities.

SUMMARY OF THE INVENTION

The invention provides a method for depositing thin layers of materials by decomposing a gas to yield a plasma, comprising the steps of:

placing a substrate on which said layer is to be deposited in a chamber;

circulating in said chamber a gaseous medium from which said material can be formed by decomposition, and maintaining the gaseous medium at a pressure between $10^{-2}$ and $10^{-4}$ torr in the vicinity of the substrate;

applying a high-frequency alternating voltage between a conductive earth surface and a conductive target surface located on opposite sides of the substrate so as to form a plasma in said chamber in the vicinity of the substrate; and connecting said substrate to the target surface through a biasing impedance and wherein said step of circulating said gaseous medium in said chamber comprises introducing the gaseous medium into the chanber via a tube in which the pressure is maintained between 0.2 and 4 torr, by jetting the gaseous medium from injection ports within said tube which face the substrate.

The use of a biasing impedance enables a continuing RF bias to be applied. This avoids the accumulation of charge on the substrate when the deposited material is insulative (e.g. amorphous silicon), and the bias continues to be effective unlike the case of a DC bias applied from a DC source.

Preferably there is a large pressure gradient between the injection ports and the substrate. The pressure upstream of the ports is preferably between 0.5 and 1 torr while the pressure in the vicinity of the substrate is about $10^{-3}$ torr. Under these conditions, when an RF bias is applied to the substrate, the substrate becomes negatively biased because of the difference of mobility between the ions and the electrons in the plasma. This bias creates an accelerating field for positive ions (e.g. $Si^+$). The lower the pressure in the vicinity of the substrate, the more effective is the field since the free path of the positive ions is greater. The presence of such a field increases the rate of deposition of positive ions.

The invention will now be described in more detail, by way of non-limiting example only, with reference to the accompanying diagrammatic drawings.

BRIEF DESCRIPTION OF THE DRAWINGS

Parts common to two figures have the same reference numeral in each figure.

DESCRIPTION OF PREFERRED EMBODIMENTS

Figure 1:
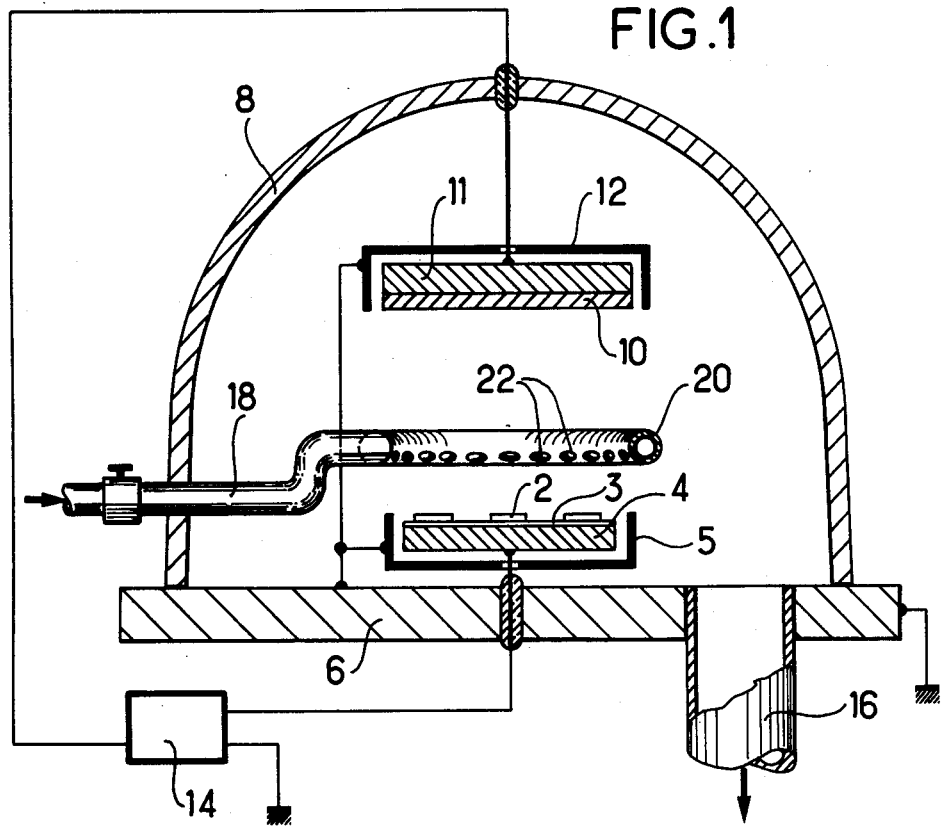
FIG. 1 is a cross-sectional view of a cathode sputtering chamber used in carrying out the method in accordance with the invention.

Referring to FIG. 1, silicon substrates 2 are to receive a deposit of silicon heavily doped with arsenic, without being heated.

The substrates 2 are placed on a thin quartz disk 3 which is itself placed on a copper substrate support 4 located without electrical contact in a metal cup 5 which forms a guard ring. The quartz disk 3 is 2 mm thick and does not prevent high frequency electrical connection between the substrate support 4 and the substrates 2. The sole function of the quartz disk 3 is to avoid chemical pollution of the substrates 2 by the support 4. The metal cup 5 is placed on a horizontal stainless steel plate 6 which forms a conductive surface connected to earth and constitutes the base of a cathode sputtering chamber. This chamber also comprises a bell-shaped stainless steel cover 8 which is sealed to the plate 6. Inside the bell 8 and above the substrate 2 is a target 10 in the form of a horizontal silicon disc which is 15 cm in diameter and 5 mm thick. The side of the silicon disc 10, facing away from the substrates 2 is supported by a stainless steel disk 11 which forms a conductive target surface. This target assembly is surrounded on all sides except that facing the substrates 2 by a metal guard ring 12 which is electrically connected to the plate 6. The metal disk 11 is insulated from the guard ring 12 and is connected to a first terminal of a high-frequency generator 14, which has a second terminal earthed by virtue of its connection to the plate 6. The generator 14 operates at a frequency of 13.56 MHz, and has a power output of 1 kW.

The base 6 incorporates a large-diameter opening which is connected to a large-bore tube 16 (in the figure the opening and tube 16 are depicted with smaller diameters than they have in reality, in order to simplify the drawing). The tube is connected to an oil vapour diffusion pump (not shown) connected to a silane trap consisting of a chamber with one wall at a temperature of 400° C. This chamber is evacuated by a vane pump with its outlet venting to atmosphere, entry of air to the pump being prevented by feeding 1.5 l/min of nitrogen at a pressure of 4 bars to an "air ballast" inlet.

The substrates 2 are electrically connected via the substrate support 4 to a third output terminal of the generator 14 which supplies a high-frequency alternating voltage whose amplitude, measured relative to earth potential, is less than the voltage applied to the metal disk 11.

Figure 2:
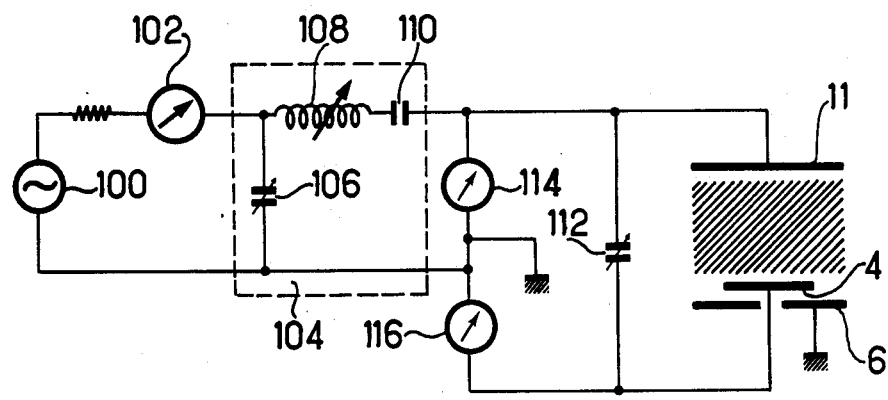
FIG. 2 is a block diagram of a high-frequency source used with the enclosure shown in FIG. 1.

Referring to FIG. 2, the generator 14 comprises a high-frequency source 100, the power output of which is measured by a wattmeter 102. The generator output is passed through a tuned circuit 104 comprising a variable shunt capacitor 106 and a variable inductor 108 in series with a fixed capacitor 110. This tuned circuit feeds the first and second output terminals of the generator, respectively connected to the metal disk 11 and to earth. A variable capacitor 112 connects the metal disk 11 to the substrate 2 and enables the biasing of the substrate relative to the plasma between the metal disk 11 and the substrate to be adjusted. The direct current voltages on the metal disk 11 and the substrate support 4 are measured by respective voltmeters 114 and 116. The negative potential relative to earth at the substrates 2 is set to a value in the range 15 to 150 volts. The potential of the substrates 2 is the same as that of the substrate support 4 since it is derived from the application of the same HF voltage with respect to the plasma.

Referring again to FIG. 1, after the substrate 2 is placed in the chamber, a mixture of gases is introduced via a tube 18 which forms a ring running around the space defined between the substrate 2 and the target assembly. This ring is located about 2 cm from the target assembly, at the interface between the exposed and obscured regions.

The pressure in the ring is maintained between 0.2 and 4 torr and preferably between 0.5 and 2 torr. The gaseous mixture escapes through twelve injection ports 22 which have a diameter of 1 to 2 mm, e.g. 1.9 m, and which are directed towards the substrates 2 so as to form inlet jets at an angle of about 45° to the vertical. The number of inlet ports may be between 8 and 20.

The flow rate of the gaseous mixture is set to produce a pressure in the enclosure of $10^{-2}$ to $10^{-4}$ torr, for example, $10^{-3}$ torr. The gaseous mixture contains 1 to 100% silane ($SiH_4$) by volume, mixed with hydrogen or argon or another very pure rare gas, and a doping gas such as $AsH_3$, $B_2H_6$ or $PH_3$, for example, 5% $AsH_3$. When the pressure in the chamber has stabilised, the generator 14 is switched on. In spite of the low temperature, the presence of the RF field results in the deposition of doped silicon. After thirty minutes a layer 1.5 microns thick has been deposited and the generator 14 is switched off. The introduction of the gaseous mixture via the tube 18 is stopped, and evacuation of the chamber via the tube 16 continues until the pressure drops to $10^{-6}$ torr.

The present invention offers the following advantages:

1. The substrate remains at a relatively low temperature, although the temperature may be increased at times, in order to produce epitaxial growth, for example.

2. The target may be of any material and need not be very pure, as it is not involved in the formation of the material to be deposited. If there is any risk of the target material polluting the semiconductor, it is only necessary to carry out the operations just described with no substrate in the enclosure. The target is then coated with a layer of the material to be deposited, and the operation can be repeated with a substrate present, the coating on the target remaining in place and preventing pollution of the semiconductor by the target. This clearly shows the difference between the method in accordance with the invention and the known method of cathode sputtering in the presence of an RF field, in which the target material is consumed to form the deposit on the substrate.

3. The layer deposited on the substrate is very regular, because of the homogeneity of the electric field in the vicinity of the substrate.

4. The density of the layer deposited on the substrate is satisfactory.

5. The rate at which the layer is deposited is between 100 and 1000 angstom units per minute, in spite of the high concentration of arsenic.

6. In the case of silicon, the deposited layer may be amorphous, polycrystalline or monocrystalline and continuous with the crystal structure of the substrate, with the appropriate surface preparation.

7. The deposited silicon layer can be of N or P type depending on the doping agent in the gaseous mixture.

8. The thickness of the deposited layer can be set accurately, even when the layer is very thin.

It may be noticed that in the event of radio frequency biasing being used for cathode sputtering deposition without the incorporation of atoms of gas in the deposited layers, the proportion of ionised or excited atoms would remain very low (less than 10%). Under such conditions the ionisation or excitation would not be necessary for obtaining the material to be deposited, but would only be useful for generating ions, or argon for example, for bombarding the target in order to transfer atoms from the target. The corresponding deposition rates would be low, for example 300 Å of silicon per minute with an RF power of 1 kW. This rate could only be reduced by an RF biasing of the substrate.

In contrast, in the present invention the excitation or ionisation has the function of decomposing the gas molecules which transport the material to be deposited, thereby extracting this material from the gas.

The proportion of molecules of this material which are excited or ionised is very large, for example 80%. The corresponding deposition rates are large, for example 700 Å of silicon per minute with an RF power of 1 kW, due to the use of RF biasing.

Figure 3:
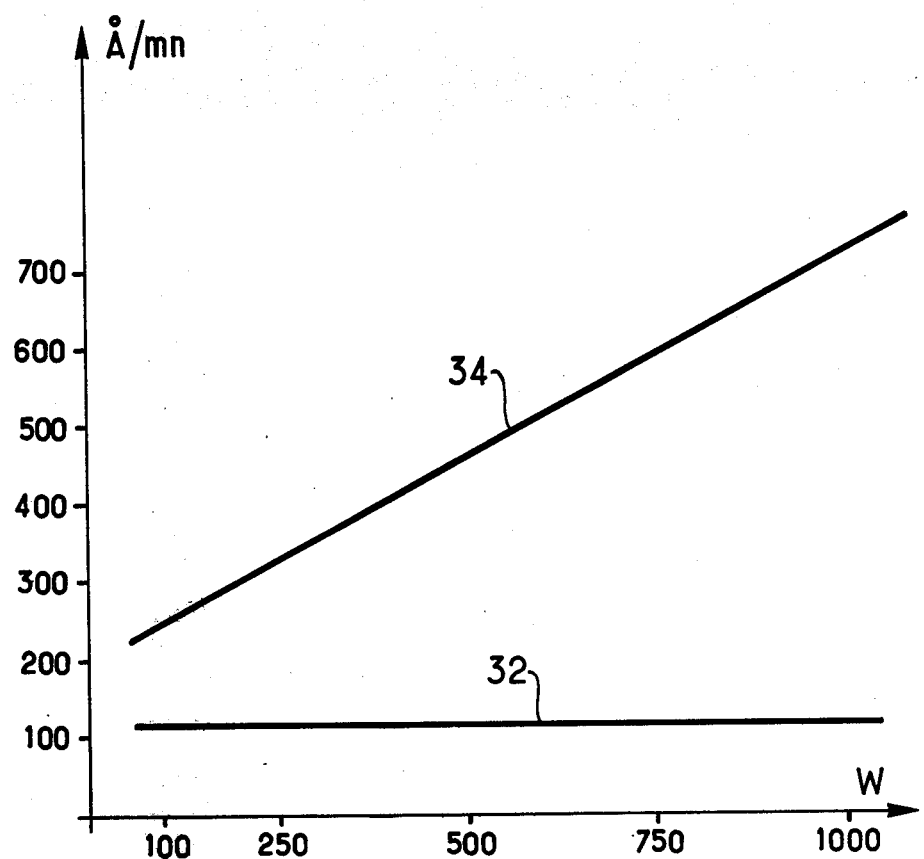
FIG. 3 is a graph showing the variation of the deposition rate as a function of the RF power.

FIG. 3 shows the variation of the deposition rate of silicon doped with arsenic plotted along the Y axis, as a function of the RF power in watts plotted along the X axis. The line 32 shows this rate to be practically constant in the absence of biasing, while the line 34 shows the rate in the presence of a bias applied in accordance with this invention. The bias for the line 34 is −50 volts applied to the substrate support 4.

The pressure in the chamber is 3/1000 torr. The distance between the target 10 and the substrates 2 is 7.5 cm. The gaseous medium contains 90% silane $SiH_4$, 5% arsine $AsH_3$ and 5% argon Ar. The other operational conditions are the same as those described above.

What is claimed is:

1. A method for depositing thin layers of material by decomposing a gas to yield a plasma, comprising the steps of:

placing a substrate on which said layer is to be deposited in a chamber;

circulating in said chamber a gaseous medium from which said material can be formed by decomposition, and maintaining the gaseous medium at a pressure between $10^{-2}$ and $10^{-4}$ torr in the vicinity of the substrate;

applying a high-frequency alternating voltage between a conductive earth surface and a conductive target surface located on opposite sides of the substrate so as to form a plasma in said chamber in the vicinity of the substrate; and connecting said substrate to the target surface through a biasing impedance, the improvement and wherein said step of circulating said gaseous medium in said chamber comprises jelling into the chamber from a tube in which the pressure is maintained between 0.2 and 4 torr, said gaseous medium through injection ports which face the substrate.

2. A method according to claim 1, wherein said biasing impedance consists of capacitance.

3. A method according to claim 2, wherein said substrate contains silicon and said gaseous medium comprises mainly of hydrogen or a rare gas and contains silane or silicon chloride so as to obtain by decomposition a deposit containing silicon.

4. A method according to claim 3, wherein said step of introducing said gaseous medium into said chamber further comprises introducing therein a molecular gas which decomposes to yield a doping impurity for the silicon semiconductor.

5. A method according to claim 4, wherein said gas which yields a doping impurity comprises one material of the group consisting of boron hydride ($B_2H_6$), phosphine ($PH_3$) and arsine ($AsH_3$).

6. A method according to claim 1, wherein said conductive earth and target surfaces are maintained flat and parallel and face one another inside said chamber and said substrate is located between said surfaces and away from the edges thereof.

7. A method according to claim 6, further comprising the step of covering said conductive surface, on the side facing said substrate, with a quartz layer.

8. A method according to claim 7, wherein prior to the introduction of said substrate into the chamber, the gaseous medium is introduced into the chamber and the alternating voltage is applied, after which the substrate is placed in the chamber and attached to the quartz layer, the gaseous medium is again introduced and the alternating voltage is again applied.

9. A method according to claim 6, wherein the said tube via which the gaseous medium is introduced into the chamber is in the form of an injection ring surrounding the space between the target surface and the substrate and the injection ports are pierced in the radially inner wall of the ring.

10. A method according to claim 1, wherein the pressure in the said tube via which the gaseous medium is introduced into the chamber is maintained between 0.5 and 2 torr, said injection ports having a diameter of between 1 and 2 mm and their number being between 8 and 20.

* * * * *